United States Patent
Chidambarrao et al.

(10) Patent No.: US 8,453,100 B2
(45) Date of Patent: May 28, 2013

(54) CIRCUIT ANALYSIS USING TRANSVERSE BUCKETS

(75) Inventors: Dureseti Chidambarrao, Weston, CT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 12/873,554

(22) Filed: Sep. 1, 2010

(65) Prior Publication Data

US 2012/0054711 A1 Mar. 1, 2012

(51) Int. Cl.
*G06F 17/50* (2006.01)

(52) U.S. Cl.
USPC .................... 716/136; 703/14; 703/2; 438/14

(58) Field of Classification Search
USPC ............................. 716/136; 703/2, 14; 438/14
See application file for complete search history.

(56) References Cited

U.S. PATENT DOCUMENTS

| | | | | |
|---|---|---|---|---|
| 7,032,194 | B1 * | 4/2006 | Hsueh et al. | 716/53 |
| 7,337,420 | B2 | 2/2008 | Chidambarrao et al. | |
| 7,542,891 | B2 * | 6/2009 | Lin et al. | 703/14 |
| 7,685,551 | B2 * | 3/2010 | Toubou et al. | 716/119 |
| 8,030,710 | B2 * | 10/2011 | Pidin | 257/369 |
| 8,079,006 | B2 * | 12/2011 | Yamasaki | 716/115 |
| 8,112,729 | B2 * | 2/2012 | Tonti et al. | 716/110 |
| 8,219,965 | B2 * | 7/2012 | Kobayashi | 716/139 |
| 2005/0040460 | A1 | 2/2005 | Chidambarrao et al. | |
| 2006/0190893 | A1 * | 8/2006 | Morton | 716/10 |
| 2007/0113210 | A1 * | 5/2007 | Mizuno et al. | 716/5 |
| 2007/0114632 | A1 * | 5/2007 | Chidambarrao et al. | 257/510 |
| 2007/0202662 | A1 * | 8/2007 | Lin et al. | 438/426 |
| 2007/0204250 | A1 * | 8/2007 | Moroz et al. | 716/10 |
| 2008/0077378 | A1 * | 3/2008 | Ikoma et al. | 703/14 |
| 2008/0127005 | A1 * | 5/2008 | Lin et al. | 716/4 |
| 2008/0195983 | A1 * | 8/2008 | Chidambarrao et al. | 716/2 |
| 2009/0079023 | A1 * | 3/2009 | Berthold et al. | 257/499 |
| 2009/0089037 | A1 * | 4/2009 | Yamada | 703/14 |
| 2009/0171644 | A1 | 7/2009 | Chidambarrao et al. | |
| 2009/0177448 | A1 | 7/2009 | Chidambarrao et al. | |
| 2009/0178012 | A1 | 7/2009 | Chidambarrao et al. | |
| 2009/0217217 | A1 * | 8/2009 | Lin et al. | 716/2 |
| 2009/0265673 | A1 | 10/2009 | Avanessian et al. | |
| 2009/0313595 | A1 * | 12/2009 | Moroz et al. | 716/10 |
| 2010/0050138 | A1 | 2/2010 | Chidambarrao et al. | |

* cited by examiner

*Primary Examiner* — Thuan Do
*Assistant Examiner* — Magid Dimyan
(74) *Attorney, Agent, or Firm* — Gibb & Riley, LLC; Richard M. Kotulak, Esq.

(57) ABSTRACT

A method (and computer program) identify shapes and locations of transistor elements within a geometric circuit layout. The transistor elements include an active area, at least one gate conductor and other transistor elements. Also, the gate conductor has sides running in a first direction, and has a width dimension running in a second direction perpendicular to the first direction. The method defines regions within the geometric circuit layout. To do so, the method defines a first region having a perimeter positioned along the sides of the gate conductor where the gate conductor intersects the active area and then expands the perimeter of the first region in the second direction to edges of the active area to define a perimeter of a second region. The first region and the second share perimeters in the first direction. The method then expands the perimeter of the second region in the first direction to define a perimeter of a third region. The second region and the third region share perimeters in the second direction. The method then separately evaluates effects the other transistor elements have within each of the first region, the second region, and the third region, to determine a characteristic of the gate conductor.

20 Claims, 11 Drawing Sheets

CIRCUIT ANALYSIS USING TRANSVERSE BUCKETS

BACKGROUND

The present invention relates to methods and systems of performing an analysis on integrated circuit designs, and more particularly to methods and systems that utilize regions (buckets) to evaluate different portions of a given circuit design.

As described in U.S. Pat. No. 7,337,420 (the complete disclosure of which is incorporated herein by reference) stress can be applied in semiconductor devices to increase the mobility of electrons or holes in such devices. For example, stress can be applied to the channel of field effect transistors (FETs) by using intrinsically stressed films such as the liner film that is used normally in the formation of metal contact (MC) terminals to the source and drain regions of the FET. Stress films can typically be nitride films because nitride films are compatible with the silicon fabrication process steps used for contact formation and etching. Liner films exert stress on an isolated FET gate (also called the "victim" gate) by adhering to adjacent surfaces such as the wafer surface and "pushing" or "pulling" on the gate structures. The stress is transferred primarily through the gate spacers, which are self-aligned to the gate polysilicon (PC). A liner-film with inherent tensile stress transfers tensile stress, and is used for improving electron mobility in n-type FETs (NFETS), while a liner film with inherent compressive stress transfers compressive stress, and is used for improving hole mobility in p-type FETs (PFETs).

As described in U.S. Pat. No. 7,337,420, one factor that dilutes the effectiveness of nitride liners is that the contact metallurgy, particularly to the source and drain regions, requires parts of the liner to be etched away very near the device. This not only disrupts the ability of the long film runway to transfer stress, but also moves the singularity/edge that would influence the channel further away, severely reducing the stress benefit. Other structures that are on the same physical level above the silicon surface such as contact metallurgy and that interrupt the film can also have the same effect. An example of such a structure is polysilicon wiring.

As described in U.S. Pat. No. 7,337,420, an even more serious concern is that these structures can be arbitrarily designed and therefore have a difficult predicting effect on performance, either positive or negative. Layout-dependent factors that influence the stress include the spacing between the victim gate and adjacent structures, the dimensions of these adjacent structures, the amount of contact coverage (or source/drain strapping), and in the case of dual-stress liner technologies (one liner for NFETS and a different liner for PFETS), the proximity of the interface between the two liner films. Small changes in FET layout can introduce noticeable shifts in drive current, and this variation can appear to change device to device across a chip. Not accounting for this magnitude of variation in stress benefit can seriously underpredict or overpredict electrical performance in circuit simulation. Furthermore, with information about the influence of stress on a given layout, circuit designers can optimize their designs for exploiting stress.

SUMMARY

According to one embodiment of the present invention, a method herein identifies shapes and locations of transistor elements within a geometric circuit layout using a computerized device. The transistor elements include an active area, at least one gate conductor and other transistor elements. Also, the gate conductor has sides running in a first direction, and has a width dimension running in a second direction perpendicular to the first direction. This method defines regions within the geometric circuit layout using the computerized device. To do so, this method defines a first region having a perimeter positioned along the sides of the gate conductor where the gate conductor intersects the active area and then expands the perimeter of the first region in the second direction to edges of the active area to define a perimeter of a second region. The first region and the second share perimeters in the second direction. This method then expands the perimeter of the second region in the first direction to define a perimeter of a third region. The second region and the third region share perimeters in the first direction. This method then evaluates effects the other transistor elements have within the third region, to determine a characteristic of the gate conductor using the computerized device.

According to one embodiment of the present invention, a method herein converts an integrated circuit design into a geometric circuit layout using a computerized device and identifies shapes and locations of transistor elements within the geometric circuit layout using the computerized device. The transistor elements include an active area, at least one gate conductor, at least one stress-producing layer (stress memorization technique (SMT), embedded stressors, etc.), and other transistor elements. Also, the gate conductor has sides running in a first direction, and has a width dimension running in a second direction perpendicular to the first direction. This method defines regions within the geometric circuit layout using the computerized device. To do so, this method defines a first region having a perimeter positioned along the sides of the gate conductor where the gate conductor intersects the active area and then expands the perimeter of the first region in the second direction to edges of the active area to define a perimeter of a second region. The first region and the second share perimeters in the second direction. This method then expands the perimeter of the second region in the first direction to define a perimeter of a third region. The second region and the third region share perimeters in the first direction. This method then evaluates effects the other transistor elements have within the third region, to determine the amount of stress within the gate conductor using the computerized device. Finally this method outputs the amount of stress from the computerized device.

According to another embodiment of the present invention, a method herein converts an integrated circuit design into a geometric circuit layout using a computerized device and identifies shapes and locations of transistor elements within the geometric circuit layout using the computerized device. The transistor elements include an active area, at least one gate conductor, at least one stress-producing layer, and other transistor elements. Also, the gate conductor has sides running in a first direction, and has a width dimension running in a second direction perpendicular to the first direction. This method defines regions within the geometric circuit layout using the computerized device. To do so, this method defines a first region having a perimeter positioned along the sides of the gate conductor where the gate conductor intersects the active area and then expands the perimeter of the first region in the second direction to edges of the active area to define a perimeter of a second region. The first region and the second share perimeters in the second direction. This method then expands the perimeter of the second region in the first direction to define a perimeter of a third region and similarly expands the perimeter of the third region in the first direction to define a perimeter of a fourth region. The second region, third region, and fourth region share perimeters in the first direction. This method then separately evaluates effects the other transistor elements have on the stress-producing layer within each of the third region and the fourth region to determine the amount of stress that the stress-producing layer will generate within the gate conductor using the computerized device. Finally this method outputs the amount of stress from the computerized device.

According to a further embodiment of the present invention, a computer program product for determining an amount of stress within a gate conductor comprises a computer readable storage medium having computer readable program code embodied therewith. The computer readable program code is configured to perform a method that converts an integrated circuit design into a geometric circuit layout using a computerized device and identifies shapes and locations of transistor elements within the geometric circuit layout using the computerized device. The transistor elements include an active area, at least one gate conductor and other transistor elements. Also, the gate conductor has sides running in a first direction, and has a width dimension running in a second direction perpendicular to the first direction. This method defines regions within the geometric circuit layout using the computerized device. To do so, this method defines a first region having a perimeter positioned along the sides of the gate conductor where the gate conductor intersects the active area and then expands the perimeter of the first region in the second direction to edges of the active area to define a perimeter of a second region. The first region and the second share perimeters in the second direction. This method then expands the perimeter of the second region in the first direction to define a perimeter of a third region. The second region and the third region share perimeters in the first direction. This method then evaluates effects the other transistor elements have within the third region, to determine the amount of stress within the gate conductor using the computerized device. Finally this method outputs the amount of stress from the computerized device.

DETAILED DESCRIPTION

Figure 1:
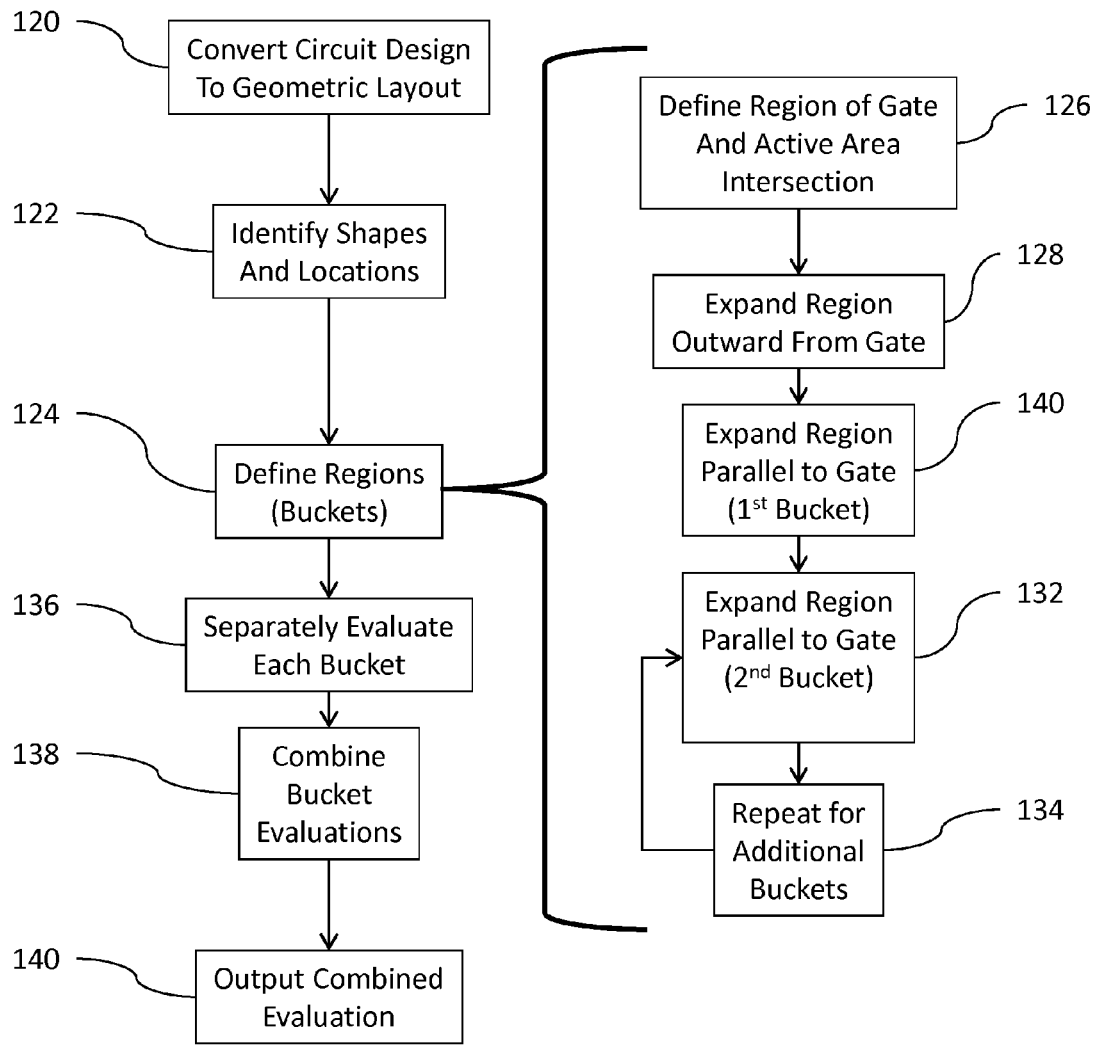
FIG. 1 is a flowchart illustrating an embodiment herein.

As shown in flowchart form in FIG. 1, in item 120, one method herein converts an integrated circuit design into a geometric circuit layout using a computerized device. Next, in item 122, this method identifies shapes and locations of transistor elements within the geometric circuit layout, again using the computerized device.

As described in U.S. Pat. No. 7,337,420, an extraction program can be executed to provide a netlist annotated with stress parameters including: areas, perimeters, distances and shape vertices. One example extraction program is the Efficient Rapid Integrated Extraction (ERIE) parasitic model extraction tool from IBM Corporation, that typically provides circuit-level netlists from layout design data, and extracts interconnect resistance and capacitance. Other examples of extraction tools include the Calibre tool, available from Mentor Graphics Corp, San Jose, Calif., and the Star-RCXT tool, available from Synopsys, Inc., Mountain View, Calif. Thus, in the first phase of the algorithm, the extraction tool provides layout-dependent information including non-specific shape information.

Figure 2:
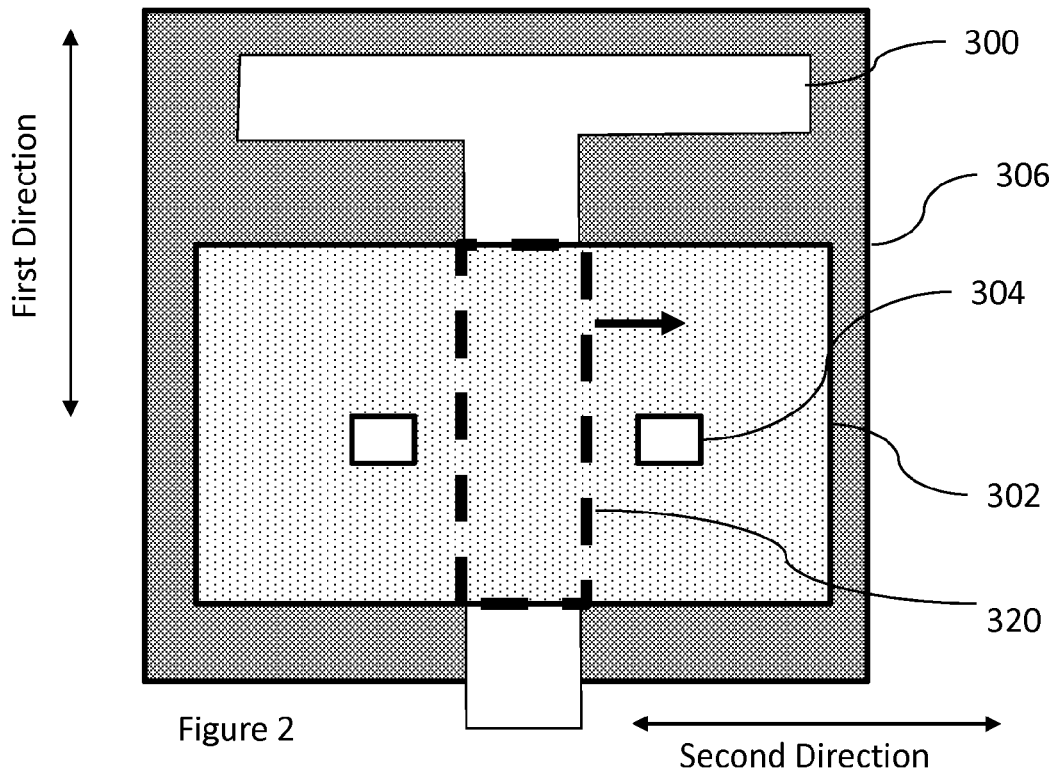
FIG. 2 is a top-view schematic diagram of a portion of a geometric circuit diagram processed according to embodiments herein.

As shown in FIG. 2, the transistor elements include an active area 302, at least one gate conductor 300, at least one stress-producing layer 306, and other transistor elements 304. The other transistor elements 304 can comprise, for example, wiring structures and contact structures. Also, the gate conductor 300 has sides running in a first direction, and has a width dimension running in a second direction perpendicular to the first direction. In FIGS. 3-8 the first and second directions and stress-producing layer 306 have intentionally not been shown to avoid clutter within the drawings; however, those ordinarily skilled in the art would understand that the stress-producing layer 306 could appear in all structures.

Figure 3:
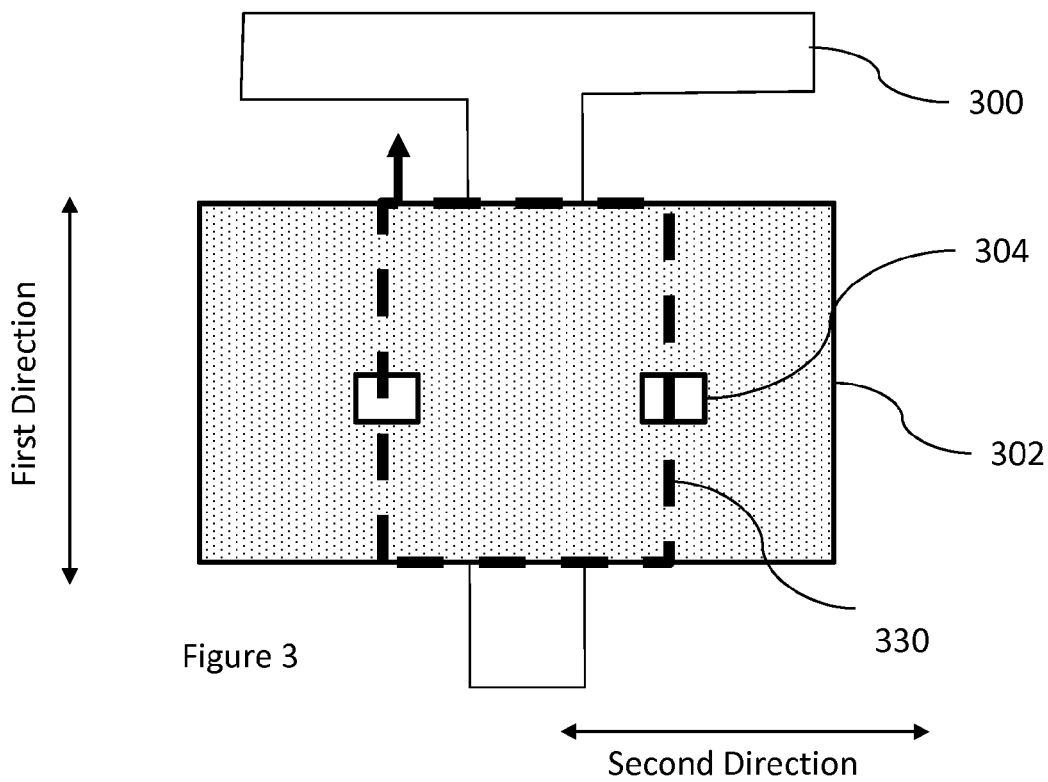
FIG. 3 is a top-view schematic diagram of a portion of a diagram processed according to embodiments herein.

Referring again to FIG. 1, in item 124, this method then defines regions (buckets) within the geometric circuit layout using the computerized device. To do so, as shown in item 126 in FIG. 1 and in FIG. 3, this method defines a first region 320 having a perimeter positioned along the sides of the gate conductor 300 where the gate conductor 300 intersects the active area 302. In item 128, this method expands the perimeter of the first region 320 in the second direction (outward from the gate) to edges of the active area 302 to define the perimeter of a second region 330. As shown in FIGS. 2 and 3, the first region 320 and the second region 330 share perimeters in the second direction.

Figure 4:
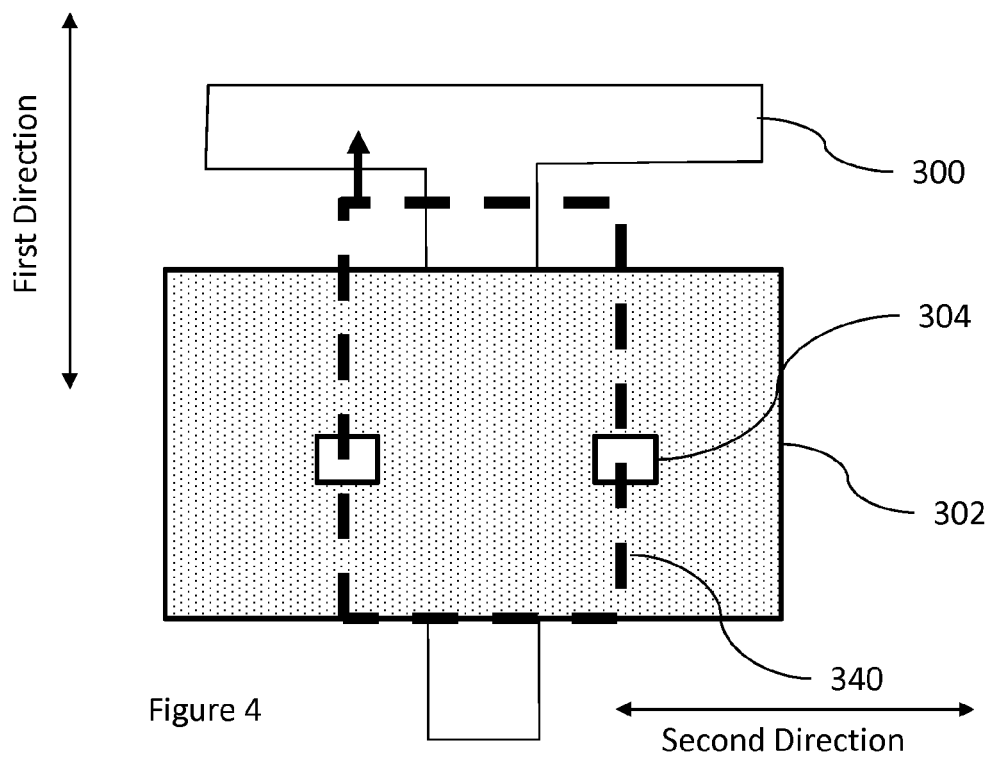
FIG. 4 is a top-view schematic diagram of a portion of a geometric circuit diagram processed according to embodiments herein.
Figure 5:
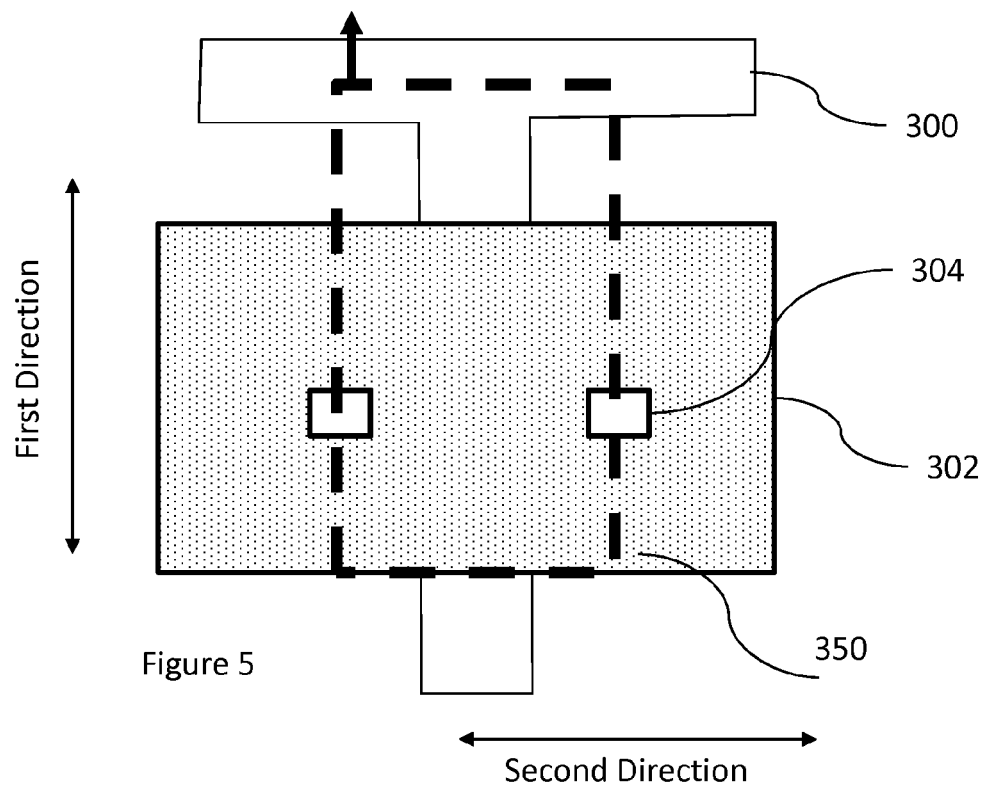
FIG. 5 is a top-view schematic diagram of a portion of a geometric circuit diagram processed according to embodiments herein.

As shown in item 140 in FIG. 1 and in FIG. 4, this method then expands the perimeter of the second region in the first direction (parallel to the sides of gate) to define a perimeter of a third region 340 (Bucket 1). As shown in item 132 in FIG. 1 and in FIG. 5, this method then similarly expands the perimeter of the third region 340 in the first direction to define a perimeter of a fourth region 350 (Bucket 2).

Figure 6:
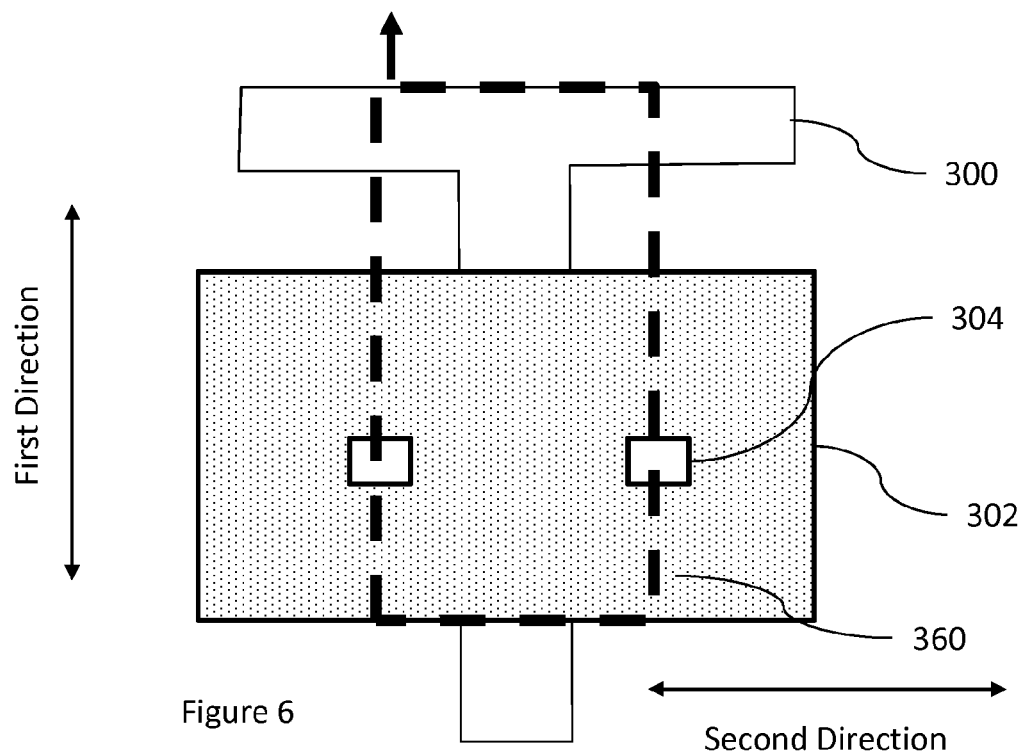
FIG. 6 is a top-view schematic diagram of a portion of a geometric circuit diagram processed according to embodiments herein.
Figure 7:
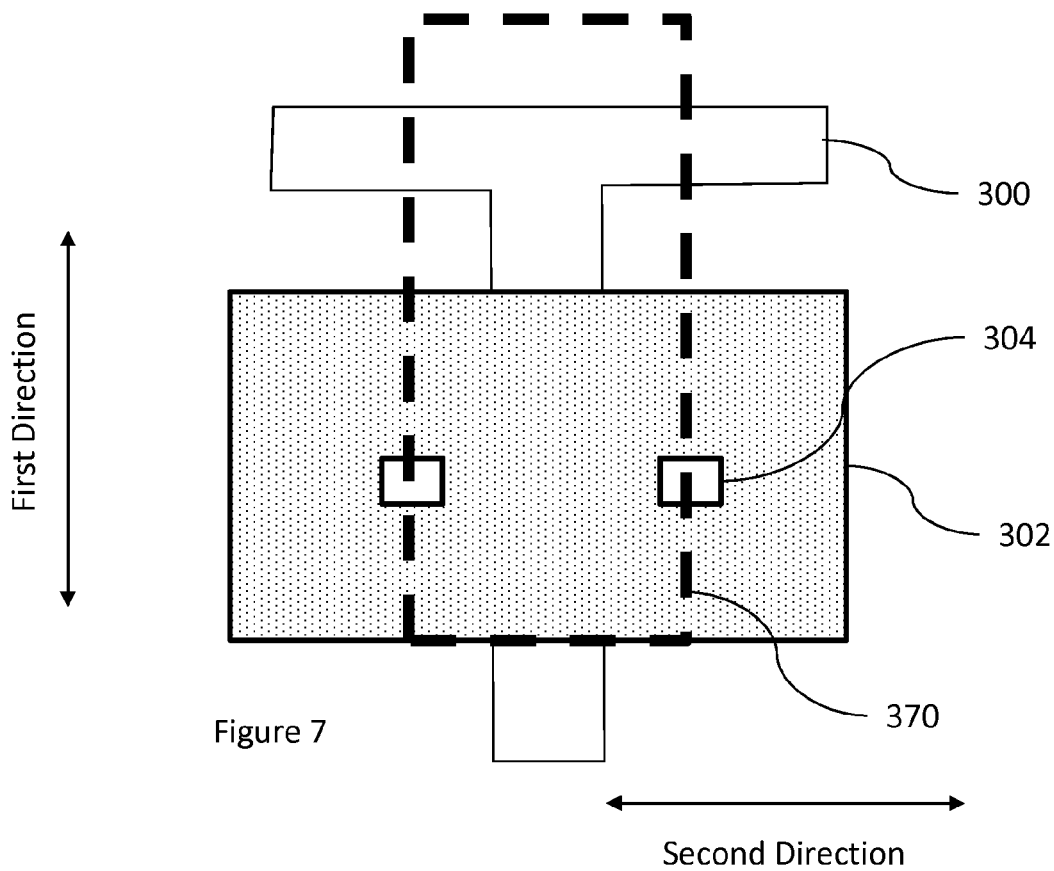
FIG. 7 is a top-view schematic diagram of a portion of a geometric circuit diagram processed according to embodiments herein.

This process of forming "buckets" can be repeated (item 134) as many times as is desired. Therefore, as shown in FIG. 6, this method then similarly expands the perimeter of the fourth region 350 in the first direction to define a perimeter of a fifth region 360 (Bucket 3). As similarly shown in FIG. 7, this method expands the perimeter of the fifth region 360 in the first direction to define a perimeter of a sixth region 370 (Bucket 4). The second through sixth regions share perimeters in the first direction and are overlapping regions.

Figure 8:
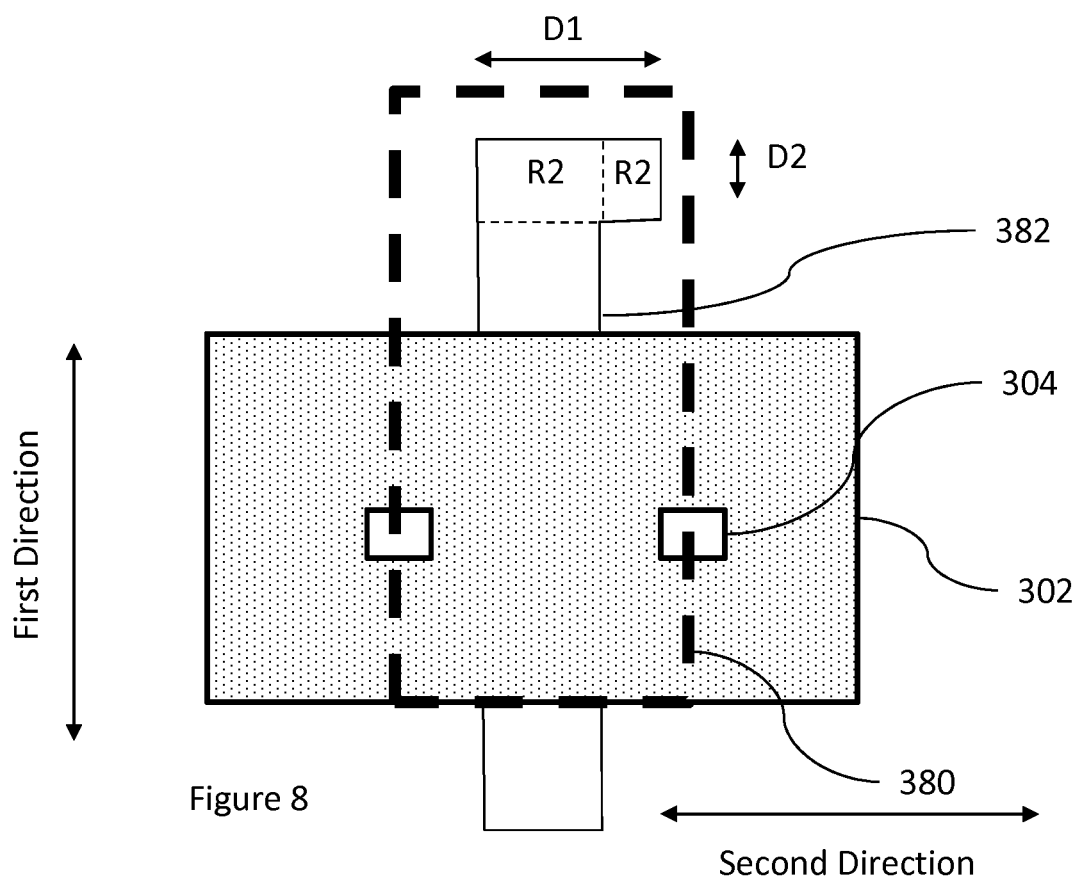
FIG. 8 is a top-view schematic diagram of a portion of a geometric circuit diagram processed according to embodiments herein.

FIG. 8 illustrates a few of the ways in which environments herein utilize the regions (buckets) that are discussed above. For example, in FIG. 8, one of the buckets is identified as item 380. Bucket 380 includes an L-shaped structure 382. The length of the sides and the position of the vertices allow the dimensions (D1, D2, etc.) of multiple rectangles (R1, R2, etc.) to be known. These different rectangles can be combined in order to evaluate the effect that the structure 382 may have relative to other structures within the integrated circuit design.

As shown in item 136 in FIG. 1, this method then separately evaluates effects the other transistor elements have on the stress-producing layer within each of the third through sixth regions to determine a characteristic of the gate conductor, such as the amount of stress that the stress-producing layer will generate within the gate conductor 300 using the computerized device.

As explained in U.S. Pat. No. 7,337,420 a "bucket" refers to a two-dimensional region. Any shape or portion of a shape that is found in a bucket is represented by the number of vertices in the shape, the total area of the shape, and the perimeter of the shape. Overall this provides a compact and uniform method for describing the shapes in the neighborhood of the gate. By analyzing multiple adjacent buckets, the location and size of adjacent shapes can be determined.

When performing stress calculations, many different parameters are obtained, such as gate orientation, metal conductor mask (MC) and polysilicon conductor mask (PC) location, area, perimeter, etc. in each bucket. The methods herein use equations to extract distances from area and perimeter components, links real and perimeter components across buckets, and feed such results into an analytical stress calculation, which provides effects on mobility, currents, and other model quantities and sums all of the various stress effects appropriately. See U.S. Pat. No. 7,337,420 for a more complete discussion of such calculations and modeling.

When evaluating the effects of the other devices, the method computes any number of different characteristics parameters, such as the transverse stress value, for each of the other transistor elements as a function of perimeter, area, and vertices of the other transistor elements. The method also combines the transverse stress value from each of the regions to determine the amount of stress in item 138. Finally, in item 140, this method outputs the amount of stress from the computerized device.

Figure 9:
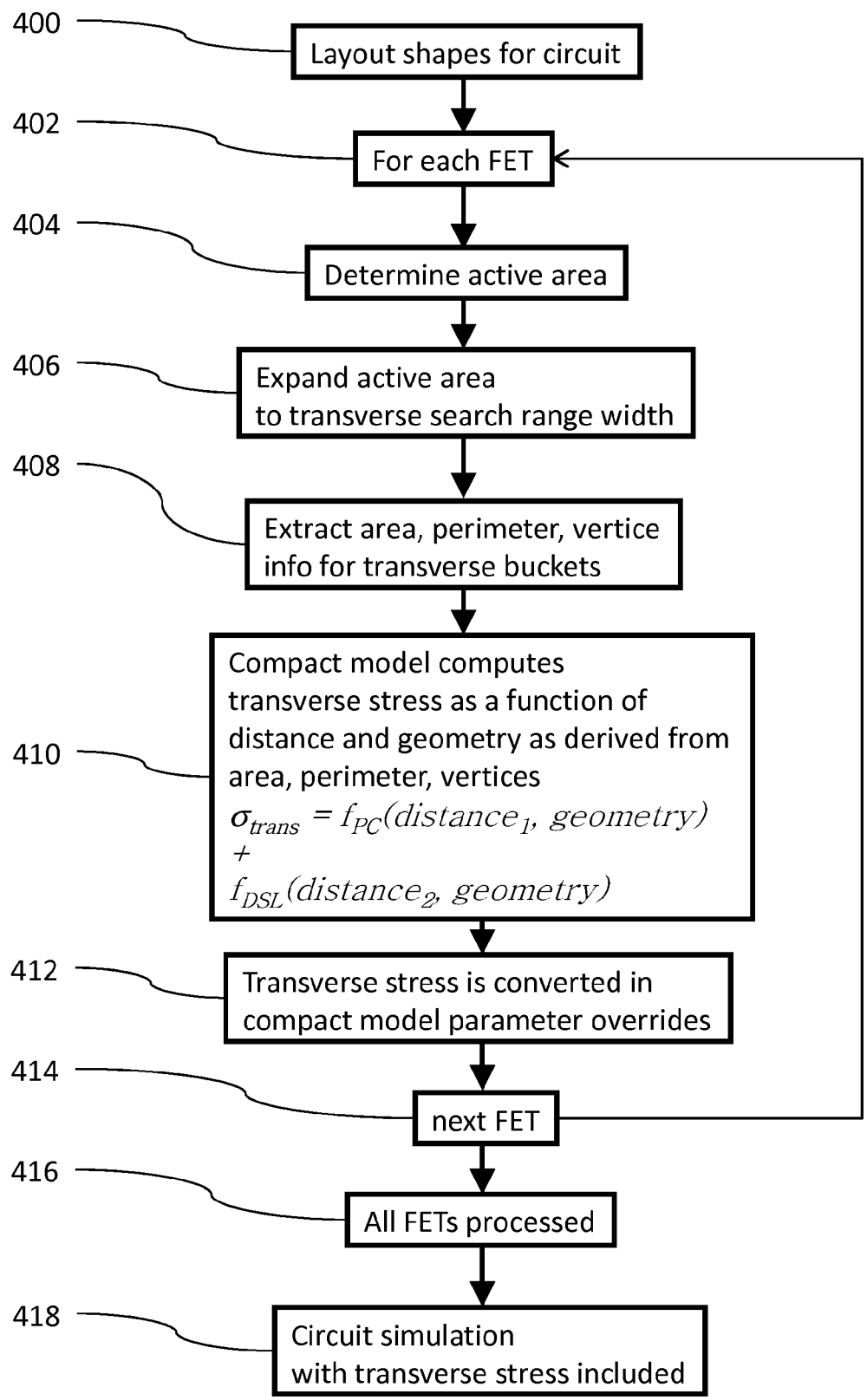
FIG. 9 is a flowchart illustrating an embodiment herein.

A more general overall flow of the embodiments herein is shown in FIG. 9. More specifically, in item 400, this flow begins by finding the layout shapes for the given circuit. In item 402, the methods herein start a processing methodology for each field effect transistor (FET). In item 404, this portion of the process determines where the active area is located. Item 406 involves expanding the active area to a transverse search range (as shown above in FIG. 3). In the drawings shown above, the transverse search range is less (smaller) than the active area; however, the transverse search range can be equal in size to the active area, greater than the active area, or less than the active area. The size of the transverse search range is selected based upon the size of the various features that will be evaluated. Therefore, circuits having geometric features that are smaller will utilize a smaller transverse search range (and resulting smaller buckets) when compared to circuits having larger geometric features.

As described in U.S. Pat. No. 7,337,420, if a bucket only covers part of a shape, then only that part is reported in that bucket. Subsequent buckets will capture more of the shape until it is entirely enclosed, assuming it all resides within that last bucket searched. The bucket/size locations are chosen such that if a portion of a new shape is found in the last bucket, this distant fragment can be treated in an approximate manner because of its relatively large distance from the victim gate. As will be described, the compact model is able to reconstruct the shape. By knowing the size of each bucket and their expansion in the particular direction (longitudinal or transverse), the position of the metal conductor mask (MC) edges (or polysilicon conductor mask (PC) edges) relative to the reference edge of the victim gate are determinable. From this information, the area, perimeter and vertices of shapes enclosed in each bucket is determined.

In item 408, the process establishes the various buckets (as described above) and then extracts the area, perimeter, vertices, etc., information for each of the transfer buckets. Item 410 represents the processing using a compact model that computes any desirable characteristic of the semiconductor device (such as the layout-dependent response of transverse stress).

As described in U.S. Pat. No. 7,337,420, a compact model that is augmented with the stress model algorithms is executed that computes stress as seen by the channel, and additionally computes effects on device carrier mobilities. The compact model may be a standard BSIM model that is compatible with a circuit simulator such as PowerSPICE, developed by IBM Corporation, Hspice, available from Synopsys, Inc., San Jose, Calif., and/or the Cadence Spectre Circuit Simulator, available from Cadence Design Systems, Inc., San Jose, Calif. BSIM or more specifically, "BSIMPD" refers to compact model code for Silicon-on-insulator (SOI) devices that is publicly available from the University of California, Berkeley. "PD" denotes "partially-depleted", but note that the subject matter disclosed herein is not limited to a specific compact model type.

In this example, the compact model 410 can compute the transverse process of function of distance and geometry as derived from area, perimeter, vertices, etc. In this example, the model could use the following equation $\sigma_{trans} = f_{PC}(\text{distance}_1, \text{geometry}) + f_{DSL}(\text{distance}_2, \text{geometry})$, where $\sigma_{trans}$ is the transverse stress, $f_{PC}$ is the function of the polysilicon conductor, and $f_{DSL}$ is the function of the stress liner. In item 412, the transverse stress is converted in the compact model using parameter overrides.

As described in U.S. Pat. No. 7,337,420, the contents of adjacent search buckets on either side of a "victim" gate are scanned, by considering restrictions such as physical layout rules, which buckets contain shapes, and the area/perimeter/vertices, the information about the number of shapes and their physical width and length. The result is a list of layout information concerning adjacent shapes on levels such as MC, PC, and liner stress film interfaces (BP/BN interface). It is understood that the method includes a "self" stress term that represents the transistor in isolation, with no nearby layout features that would degrade the stress, keeping in mind that reduced stress is considered to be undesirable since high stress of the proper type tends to increase mobility. Using the information in the search buckets, adjacent shapes are analyzed and, as appropriate, the reduction in stress is computed for each adjacent shape. This is done for both left and right sides of the transistor using the PC gate shape as a center reference, and is done for both MC and adjacent PC shapes. BP/BN interface effects are also included. With the channel stress known, the embodiments translate the stress into compact model parameters, which are utilized by the full compact model equations (such as the previously mentioned BSIM model) and by the circuit simulation program for circuit simulation. This part of the algorithm considers both longitudinal stress (along the direction of current flow in an FET) and transverse stress (parallel to the victim gate). Analytic expressions are used to make this conversion. The modified parameters can include terms such as FET mobility. The compact model parameters are then passed to the compact model code such as the above-referenced BSIM model.

Item 414 loops processing back to item 402 until, as determined in item 416, all transistors have been processed. This allows the embodiments herein to provide a circuit simulation that includes transverses stress. To the contrary, without utilizing pockets formed in the transverse direction (buckets 1-3, discussed above) the transverse stress could not be included within the circuit simulation. Further, the transverse stress can have significant impact on both Nmos and Pmos current drive. Therefore, the embodiments herein provide additional benefits that would not be seen with conventional processing, such as that discussed in U.S. Pat. No. 7,337,420.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 10:
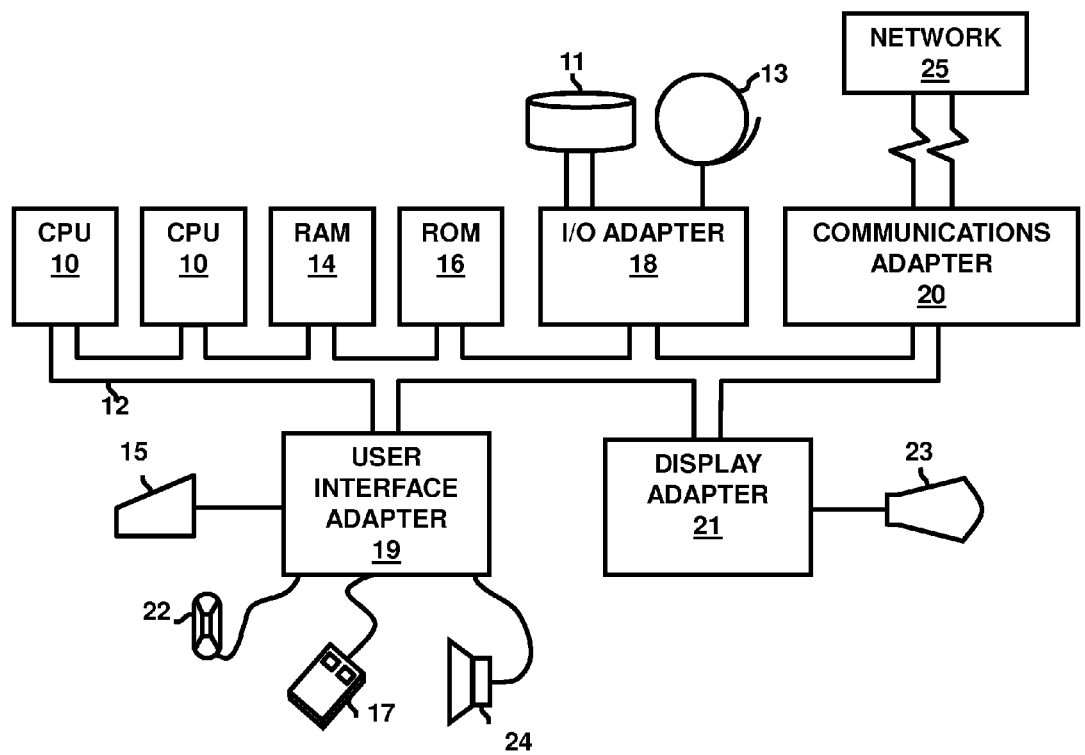
FIG. 10 is a schematic diagram of a hardware diagram according to embodiments herein.

A representative hardware environment for practicing the embodiments of the invention is depicted in FIG. 10. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other non-transitory program storage devices (storage medium) that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment types for software containing the foregoing embodiments include loading directly in the client, server and proxy computers via loading a storage medium such as a CD, DVD, etc., The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

While it is understood that the process software may be deployed by manually loading directly in the client, server and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

Figure 11:
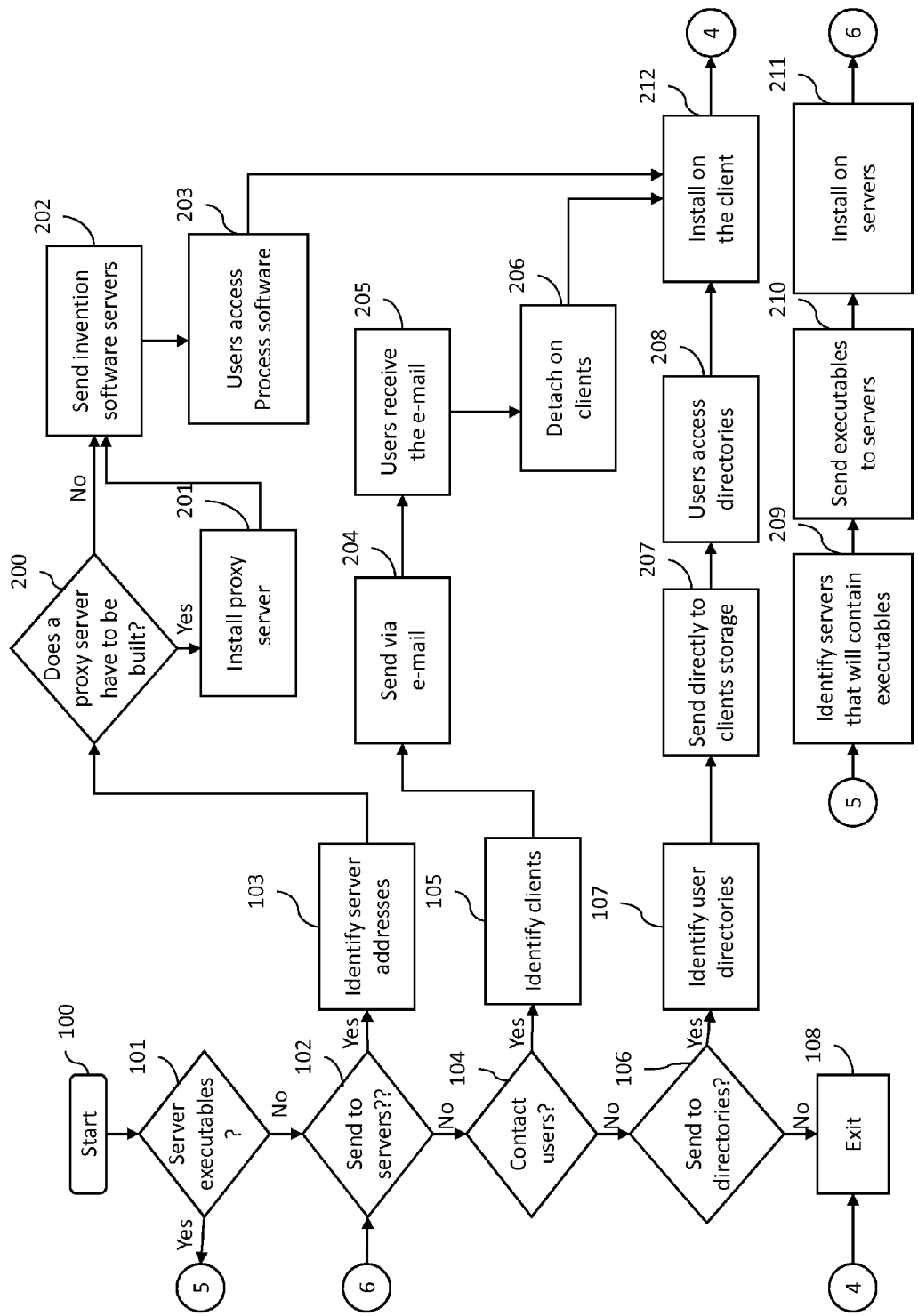
FIG. 11 is a schematic diagram of a deployment diagram according to embodiments herein.

As show in FIG. 11, Step 100 begins the deployment of the process software. The first thing is to determine if there are any programs that will reside on a server or servers when the process software is executed 101. If this is the case then the servers that will contain the executables are identified 209. The process software for the server or servers is transferred directly to the servers' storage via FTP or some other protocol or by copying though the use of a shared file system 210. The process software is then installed on the servers 211.

Next, a determination is made on whether the process software is be deployed by having users access the process software on a server or servers 102. If the users are to access the process software on servers then the server addresses that will store the process software are identified 103.

A determination is made if a proxy server is to be built 200 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required then the proxy server is installed 201. The process software is sent to the servers either via a protocol such as FTP or it is copied directly from the source files to the server files via file sharing 202. Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems 203. Another embodiment is to have the servers automatically copy the process software to each client and then run the installation program for the process software at each client computer. The user executes the program that installs the process software on his client computer 212 then exits the process 108.

In step 104 a determination is made whether the process software is to be deployed by sending the process software to users via e-mail. The set of users where the process software will be deployed are identified together with the addresses of the user client computers 105. The process software is sent via e-mail to each of the users' client computers. The users then receive the e-mail 205 and then detach the process software from the e-mail to a directory on their client computers 206. The user executes the program that installs the process software on his client computer 212 then exits the process 108.

Lastly a determination is made on whether to the process software will be sent directly to user directories on their client computers 106. If so, the user directories are identified 107. The process software is transferred directly to the user's client computer directory 207. This can be done in several ways such as but not limited to sharing of the file system directories and then copying from the sender's file system to the recipient user's file system or alternatively using a transfer protocol such as File Transfer Protocol (FTP). The users access the directories on their client file systems in preparation for installing the process software 208. The user executes the program that installs the process software on his client computer 212 then exits the process 108.

The process software can be integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 12:
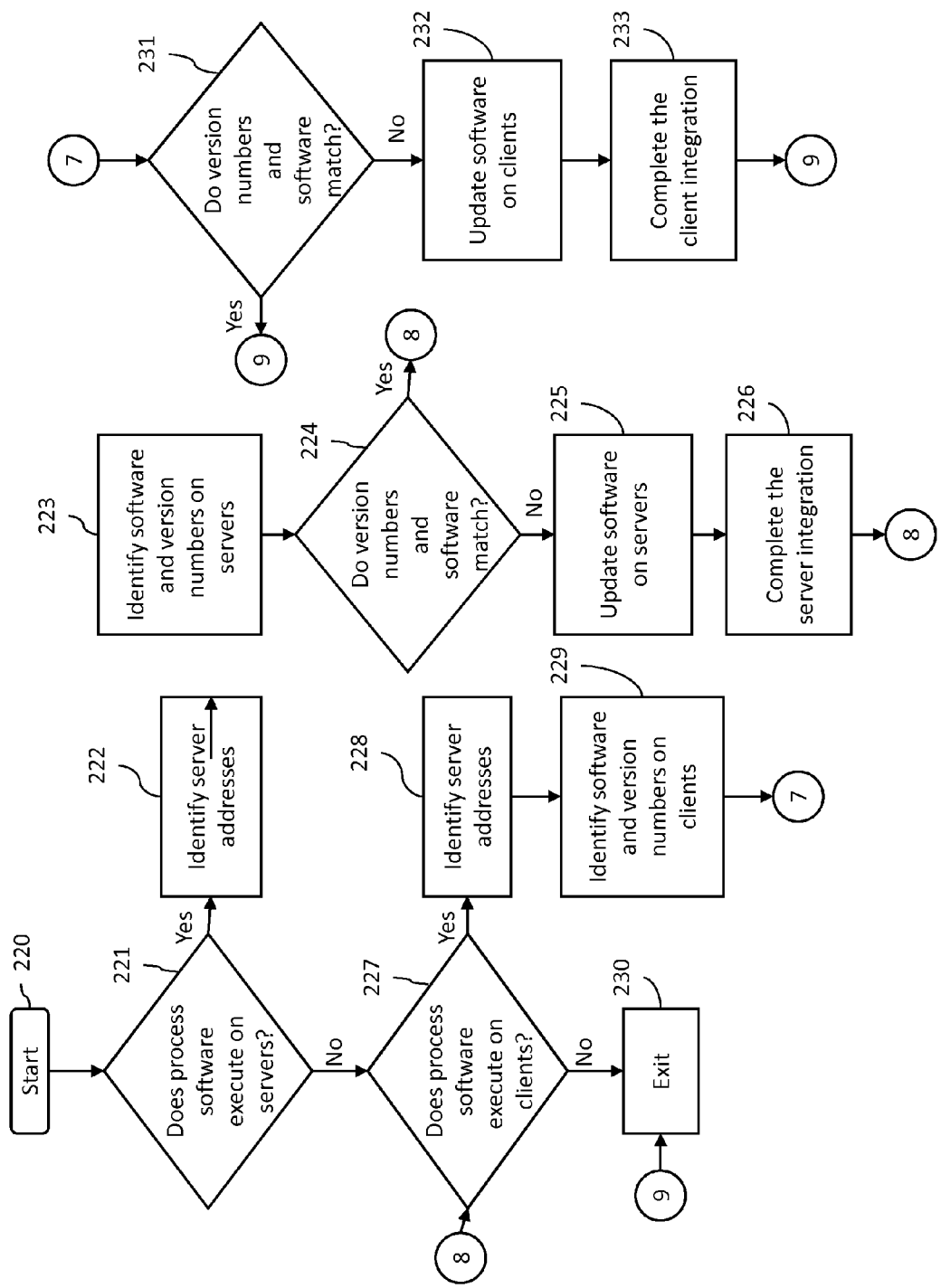
FIG. 12 is a schematic diagram of an integration diagram according to embodiments herein.
Figure 13:
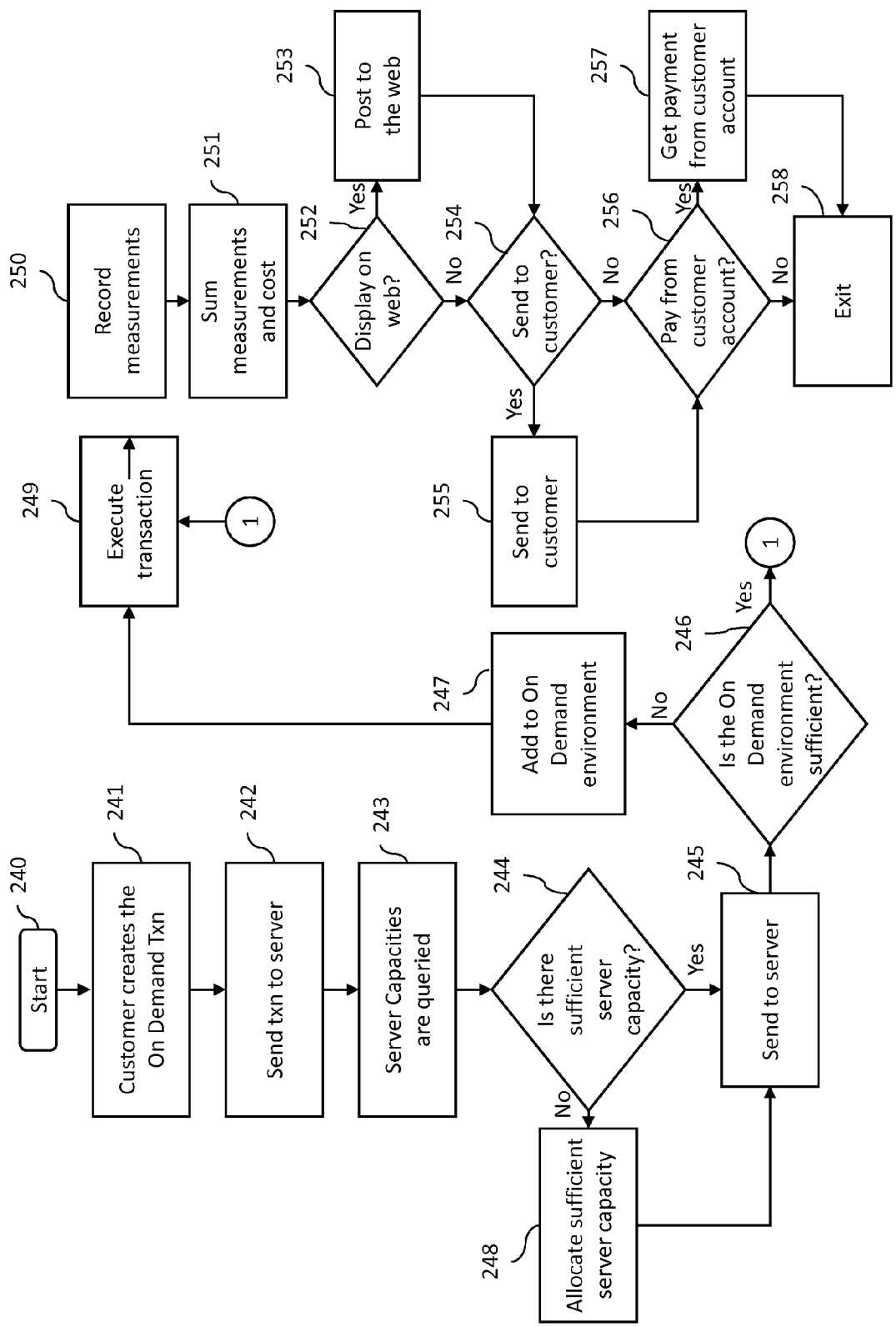
FIG. 13 is a schematic diagram of an on-demand diagram according to embodiments herein.

More specifically, as show in FIG. 12, Step 220 begins the integration of the process software. The first thing is to determine if there are any process software programs that will execute on a server or servers 221. If this is not the case, then integration proceeds to 227. If this is the case, then the server addresses are identified 222. The servers are checked to see if they contain software that includes the operating system (OS), applications, and network operating systems (NOS), together with their version numbers, that have been tested with the process software 223. The servers are also checked to determine if there is any missing software that is required by the process software 223.

A determination is made if the version numbers match the version numbers of OS, applications and NOS that have been tested with the process software 224. If all of the versions match and there is no missing required software the integration continues in 227.

If one or more of the version numbers do not match, then the unmatched versions are updated on the server or servers with the correct versions 225. Additionally if there is missing required software, then it is updated on the server or servers 225. The server integration is completed by installing the process software 226.

Step 227 which follows either 221, 224 or 226 determines if there are any programs of the process software that will execute on the clients. If no process software programs execute on the clients the integration proceeds to 240 and exits. If this not the case, then the client addresses are identified 228.

The clients are checked to see if they contain software that includes the operating system (OS), applications, and network operating systems (NOS), together with their version numbers, that have been tested with the process software 229.

The clients are also checked to determine if there is any missing software that is required by the process software 229.

A determination is made as to whether the version numbers match the version numbers of OS, applications and NOS that have been tested with the process software 241. If all of the versions match and there is no missing required software, then the integration proceeds to 240 and exits.

If one or more of the version numbers do not match, then the unmatched versions are updated on the clients with the correct versions 232. In addition, if there is missing required software then it is updated on the clients 232. The client integration is completed by installing the process software on the clients 233. The integration proceeds to 240 and exits.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise when other measurements of use such as network bandwidth, memory usage, storage usage, etc. approach a capacity so as to affect performance, additional network bandwidth, memory usage, storage etc. are added to share the workload. The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider. In another embodiment, the service provider requests payment directly from a customer account at a banking or financial institution. In another embodiment, if the service provider is also a customer of the customer that uses the process software application, the payment owed to the service provider is reconciled to the payment owed by the service provider to minimize the transfer of payments.

The process software can be shared, simultaneously serving multiple customers in a flexible, automated fashion. It is standardized, requiring little customization and it is scalable, providing capacity on demand in a payas-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

More specifically, as shown in Step 240 begins the On Demand process. A transaction is created than contains the unique customer identification, the requested service type and any service parameters that further specify the type of service 241. The transaction is then sent to the main server 242. In an On Demand environment the main server can initially be the only server, then as capacity is consumed other servers are added to the On Demand environment.

The server central processing unit (CPU) capacities in the On Demand environment are queried 243. The CPU requirement of the transaction is estimated, then the servers available CPU capacity in the On Demand environment are compared to the transaction CPU requirement to see if there is sufficient CPU available capacity in any server to process the transaction 244. If there is not sufficient server CPU available capacity, then additional server CPU capacity is allocated to process the transaction 248. If there was already sufficient Available CPU capacity then the transaction is sent to a selected server 245.

Before executing the transaction, a check is made of the remaining On Demand environment to determine if the environment has sufficient available capacity for processing the transaction. This environment capacity consists of such things as but not limited to network bandwidth, processor memory, storage etc. 246. If there is not sufficient available capacity, then capacity will be added to the On Demand environment 247. Next the required software to process the transaction is accessed, loaded into memory, then the transaction is executed 249.

The usage measurements are recorded 250. The usage measurements consist of the portions of those functions in the On Demand environment that is used to process the transaction. The usage of such functions as, but not limited to, network bandwidth, processor memory, storage and CPU cycles are what is recorded. The usage measurements are summed, multiplied by unit costs and then recorded as a charge to the requesting customer 251. If the customer has requested that the On Demand costs be posted to a web site 252 then they are posted 253.

If the customer has requested that the On Demand costs be sent via e-mail to a customer address 254 then they are sent 255. If the customer has requested that the On Demand costs be paid directly from a customer account 256 then payment is received directly from the customer account 257. The last step is exit the On Demand process.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed and executed through either a remote-access or a site-to-site VPN. When using the remote-access VPNs the process software is deployed, accessed and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download and execute the process software.

When using the site-to-site VPN, the process software is deployed, accessed and executed through the use of dedicated equipment and large-scale encryption that are used to connect a companies multiple fixed sites over a public network such as the Internet.

The process software is transported over the VPN via tunneling which is the process of placing an entire packet within another packet and sending it over a network. The protocol of the outer packet is understood by the network and both points, called tunnel interfaces, where the packet enters and exits the network.

Figure 14:
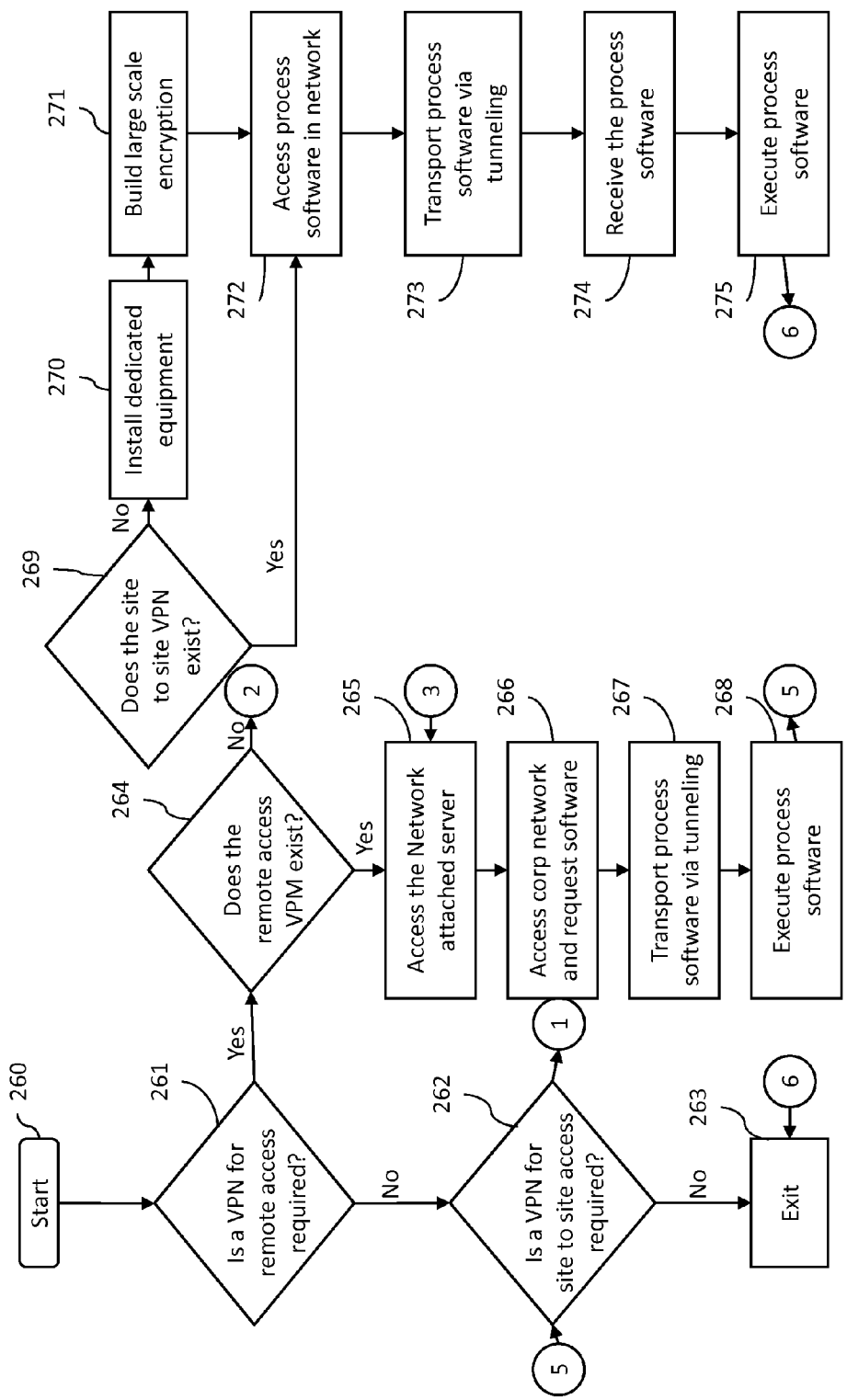
FIG. 14 is a schematic diagram of an open VPN diagram according to embodiments herein.

Thus, as show in FIG. 14, in Step 260 begins the Virtual Private Network (VPN) process. A determination is made to see if a VPN for remote access is required 261. If it is not required, then proceed to 262. If it is required, then determine if the remote access VPN exists 264.

If it does exist, then proceed to 265. Otherwise identify the third party provider that will provide the secure, encrypted connections between the company's private network and the company's remote users 276. The company's remote users are identified 277. The third party provider then sets up a network access server (NAS) 278 that allows the remote users to dial a toll free number or attach directly via a cable or DSL modem to access, download and install the desktop client software for the remote-access VPN 279.

After the remote access VPN has been built or if it been previously installed, the remote users can then access the process software by dialing into the NAS or attaching directly via a cable or DSL modem into the NAS 265. This allows entry into the corporate network where the process software is accessed 266. The process software is transported to the remote user's desktop over the network via tunneling. That is the process software is divided into packets and each packet including the data and protocol is placed within another packet 267. When the process software arrives at the remote user's desktop, it is removed from the packets, reconstituted and then is executed on the remote users desktop 268.

A determination is made to see if a VPN for site to site access is required 262. If it is not required, then proceed to exit the process 263. Otherwise, determine if the site to site VPN exists 269. If it does exist, then proceed to 272. Otherwise, install the dedicated equipment required to establish a site to site VPN 270. Then build the large scale encryption into the VPN 271.

After the site to site VPN has been built or if it had been previously established, the users access the process software via the VPN 272. The process software is transported to the site users over the network via tunneling. That is the process software is divided into packets and each packet including the data and protocol is placed within another packet 274. When the process software arrives at the remote user's desktop, it is removed from the packets, reconstituted and is executed on the site users desktop 275. Proceed to exit the process 263.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
   identifying shapes and locations of transistor elements within a geometric circuit layout using a computerized device, said transistor elements including, an active area, at least one gate conductor and other transistor elements, said gate conductor having sides running in a first direction, and having a width dimension running in a second direction perpendicular to said first direction;
   defining regions within said geometric circuit layout using said computerized device by:
      defining a first region having a perimeter positioned along edges of said sides of said gate conductor; and
      expanding said perimeter of said first region in said first direction to define a perimeter of at least one additional region,
      said first region and said additional region sharing perimeters in said first direction; and
   evaluating effects said other transistor elements have within said additional region to determine a characteristic within said gate conductor using said computerized device.

2. The method according to claim 1, said evaluating of said effects comprising computing a transverse stress value for each of said other transistor elements as a function of perimeter, area, and vertices of said other transistor elements.

3. The method according to claim 2, said evaluating of said effects further comprising combining said transverse stress value from each of said regions to determine said characteristic.

4. The method according to claim 1, said regions comprising overlapping regions.

5. The method according to claim 1, said other transistor elements comprising wiring structures and contact structures.

6. A method comprising:
   converting an integrated circuit design into a geometric circuit layout using a computerized device;
   identifying shapes and locations of transistor elements within said geometric circuit layout using said computerized device, said transistor elements including, an active area, at least one gate conductor and other transistor elements, said gate conductor having sides running in a first direction, and having a width dimension running in a second direction perpendicular to said first direction;
   defining regions within said geometric circuit layout using said computerized device by:
      defining a first region having a perimeter positioned along edges of said sides of said gate conductor; and
      expanding said perimeter of said first region in said first direction to define a perimeter of at least one additional region,
      said first region and said additional region sharing perimeters in said first direction;
   evaluating effects said other transistor elements have within said additional region to determine an amount of stress within said gate conductor using said computerized device; and
   outputting said amount of stress from said computerized device.

7. The method according to claim 6, said evaluating of said effects comprising computing a transverse stress value for each of said other transistor elements as a function of perimeter, area, and vertices of said other transistor elements.

8. The method according to claim 7, said evaluating of said effects further comprising combining said transverse stress value from each of said regions to determine said amount of stress.

9. The method according to claim 6, said regions comprising overlapping regions.

10. The method according to claim 6, said other transistor elements comprising wiring structures and contact structures.

11. A method comprising:
    converting an integrated circuit design into a geometric circuit layout using a computerized device;
    identifying shapes and locations of transistor elements within said geometric circuit layout using said computerized device, said transistor elements including, an active area, at least one gate conductor, at least one stress-producing layer, and other transistor elements, said gate conductor having sides running in a first direction, and having a width dimension running in a second direction perpendicular to said first direction;

defining regions within said geometric circuit layout using said computerized device by:
- defining a first region having a perimeter positioned along said sides of said gate conductor where said gate conductor intersects said active area;
- expanding said perimeter of said first region in said second direction to edges of said active area to define a perimeter of a second region, said first region and said second region sharing parameters in said second direction; and
- expanding said perimeter of said second region in said first direction to define a perimeter of a third region;
- expanding said perimeter of said third region in said first direction to define a perimeter of a fourth region,
- said second region, said third region, and said fourth region sharing perimeters in said first direction;

separately evaluating effects said other transistor elements have on said stress-producing layer within each of said third region and said fourth region to determine an amount of stress that said stress-producing layer will generate within said gate conductor using said computerized device; and outputting said amount of stress from said computerized device.

12. The method according to claim 11, said evaluating of said effects comprising computing a transverse stress value for each of said other transistor elements as a function of perimeter, area, and vertices of said other transistor elements.

13. The method according to claim 12, said evaluating of said effects further comprising combining said transverse stress value from each of said regions to determine said amount of stress.

14. The method according to claim 11, said regions comprising overlapping regions.

15. The method according to claim 11, said other transistor elements comprising wiring structures and contact structures.

16. A computer program product for determining an amount of stress within a gate conductor, the computer program product comprising a computer readable storage medium having computer readable program code embodied therewith, the computer readable program code which, when executed by a computer performs a method comprising:

converting an integrated circuit design into a geometric circuit layout using a computerized device;

identifying shapes and locations of transistor elements within said geometric circuit layout using said computerized device, said transistor elements including, an active area, at least one gate conductor and other transistor elements, said gate conductor having sides running in a first direction, and having a width dimension running in a second direction perpendicular to said first direction;

defining regions within said geometric circuit layout using said computerized device by:
- defining a first region having a perimeter positioned along edges of said sides of said gate conductor; and
- expanding said perimeter of said first region in said first direction to define a perimeter of at least one additional region,
- said first region and said additional region sharing perimeters in said first direction;

evaluating effects said other transistor elements have within said additional region to determine an amount of stress within said gate conductor using said computerized device; and outputting said amount of stress from said computerized device.

17. The computer program product according to claim 16, said evaluating of said effects comprising computing a transverse stress value for each of said other transistor elements as a function of perimeter, area, and vertices of said other transistor elements.

18. The computer program product according to claim 17, said evaluating of said effects further comprising combining said transverse stress value from each of said regions to determine said amount of stress.

19. The computer program product according to claim 16, said regions comprising overlapping regions.

20. The computer program product according to claim 16, said other transistor elements comprising wiring structures and contact structures.

* * * * *